United States Patent [19]
Becker

[11] Patent Number: 5,768,155
[45] Date of Patent: Jun. 16, 1998

[54] FAST UNDERSAMPLING

[75] Inventor: James H. Becker, Boston, Mass.

[73] Assignee: Teradyne, Inc., Boston, Mass.

[21] Appl. No.: 760,887

[22] Filed: Dec. 6, 1996

[51] Int. Cl.[6] ........................................... G01R 23/00
[52] U.S. Cl. ................................. 364/572; 364/484
[58] Field of Search ............................. 364/481–487, 364/572–577; 324/500–556, 76.11–116

[56] References Cited

U.S. PATENT DOCUMENTS

| | | | |
|---|---|---|---|
| 4,495,586 | 1/1985 | Andrews | 364/487 |
| 4,626,827 | 12/1986 | Kitamura et al. | 364/572 |
| 4,791,404 | 12/1988 | Hollister | 324/102 |
| 4,928,251 | 5/1990 | Marzalek et al. | 364/484 |
| 5,485,395 | 1/1996 | Smith | 364/485 |
| 5,589,763 | 12/1996 | Burns | 324/76.58 |

*Primary Examiner*—James P. Trammell
*Attorney, Agent, or Firm*—Richard E. Gamache

[57] ABSTRACT

A method of operating automatic test equipment for sampling an electronic signal produced by a device under test, whereby an effective sampling frequency, $F_{EFF}$, is determined such that $F_{EFF}=NF_{REP}$, where N is a desired number of data samples and $F_{REP}$ is the repetition frequency of the electronic signal. At least one replication of the electronic signal is then sampled at a rate equal to $F_{ACT}$, where $F_{ACT}$ is equal to $F_{EFF}/K$, and K is a positive integer value other than one. The value, K, and the number of data samples, N, have no common multiplicative values. As a result, the set of data samples, obtained after sampling at least one replication of the electronic signal at the rate $F_{ACT}$, contains all of the data samples that would be obtained by sampling one replication of the electronic signal at the rate $F_{EFF}$. The set of data samples can then be reordered to facilitate subsequent analysis of the data samples by the automatic test equipment.

4 Claims, 6 Drawing Sheets

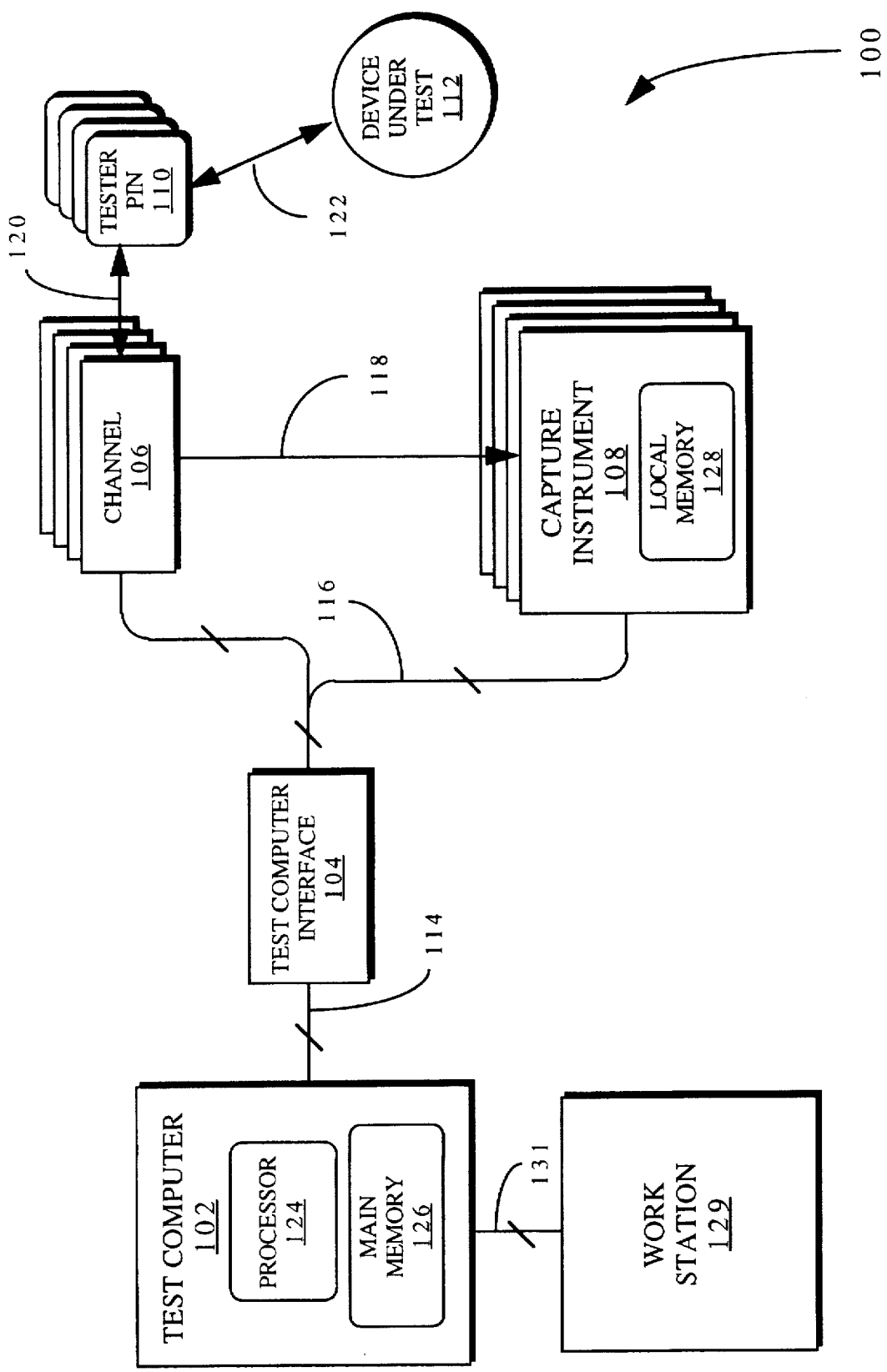
FIG. 1A - PRIOR ART

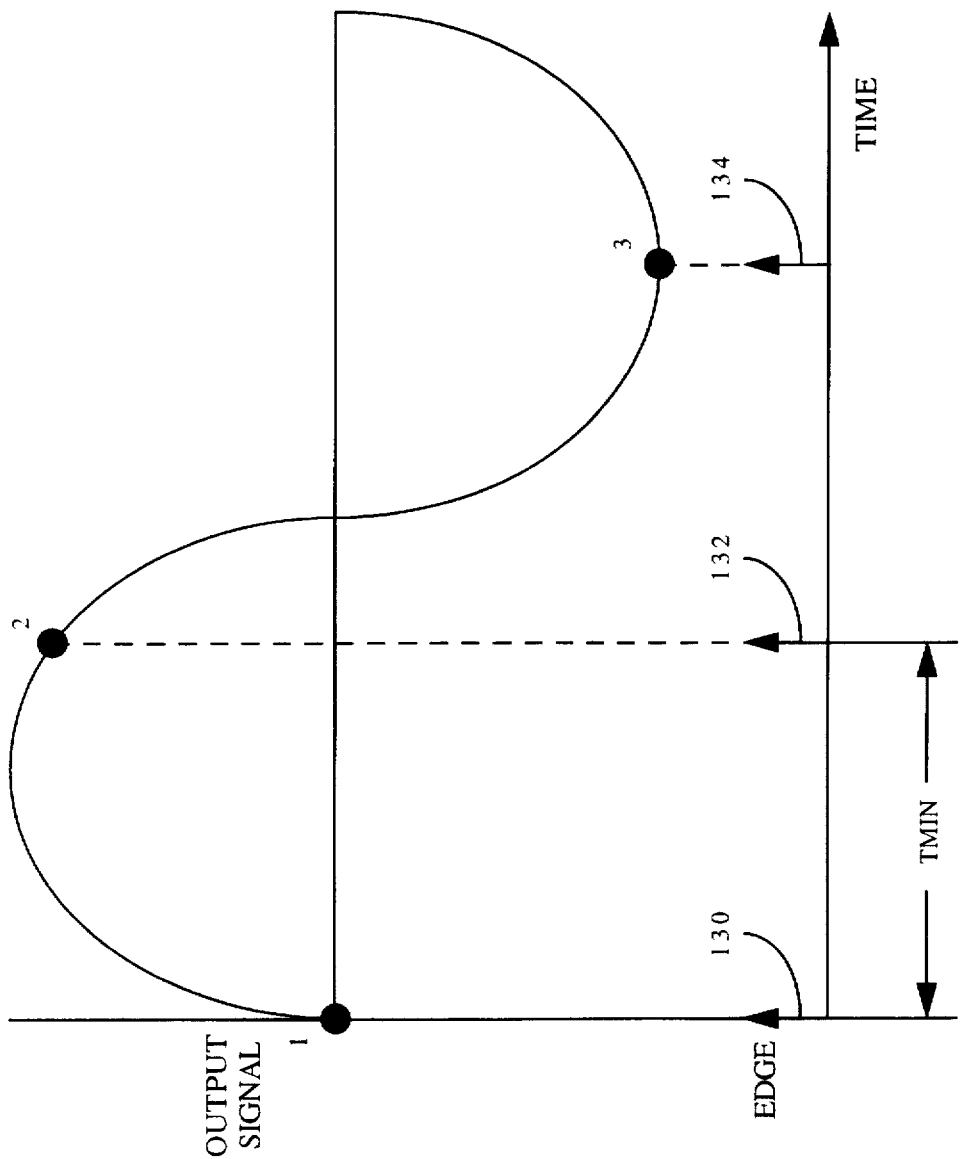
FIG. 1B - PRIOR ART

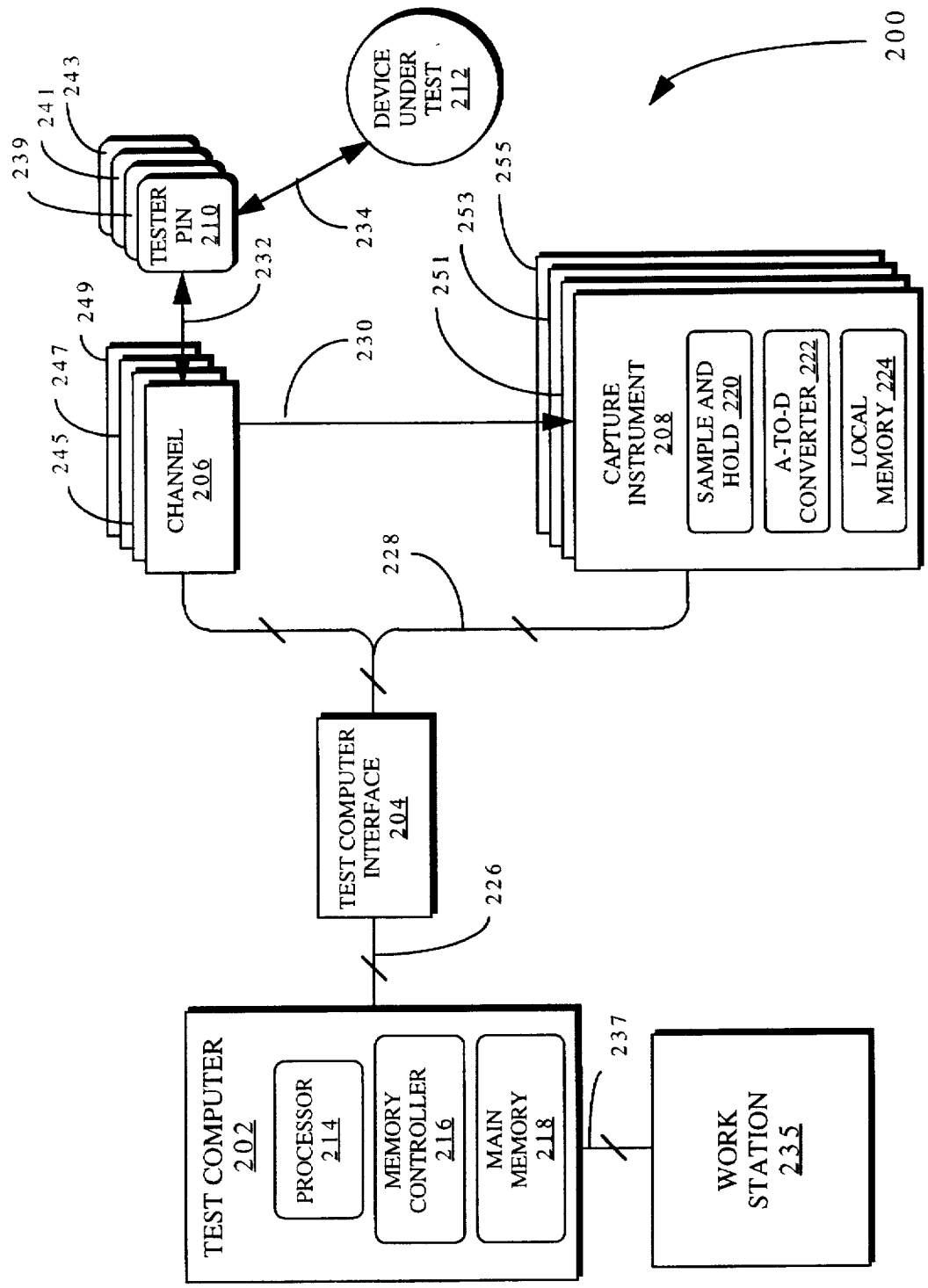
FIG. 2A - PRIOR ART

FAST UNDERSAMPLING

BACKGROUND OF THE INVENTION

This invention relates generally to automatic test equipment, and more particularly to automatic test equipment for performing data processing on signals generated by an electronic circuit.

Manufacturers of semiconductor devices commonly use automatic test equipment, also known as "testers," to determine whether the devices contain manufacturing defects. In general, each tester includes a test computer for providing computerized control, capture instruments for performing data acquisition functions, channels for either applying signals to each device or measuring signals produced by each device, and tester pins.

Each tester pin generally connects one of the channels to an electrical node of a device under test (DUT). Each channel typically receives either digital or analog signals produced by the DUT. In the latter case, one of the capture instruments usually samples the analog signals to obtain sampled data, and then converts the sampled data to digital form so that the test computer can perform data processing operations.

Testers generally operate by executing test programs. A typical test program includes numerous test functions that direct the tester to perform various operations such as setting-up the channels and the capture instruments, applying a test signal to a node of the DUT, sampling an output signal at another node of the DUT, moving data from a local memory in one of the capture instruments to a main memory in the test computer, analyzing the data, and executing a test statement. The test statement generally includes additional functions such as comparing the analysis results with specified limits, and data-logging and binning the analysis results.

FIG. 1A shows a block diagram of prior art tester 100, such as the model A580 tester, sold by Teradyne, Inc., Boston, Mass., USA. Computer work station 129 controls tester 100. A test engineer typically develops test programs on work station 129, and then loads the test programs into main memory 126 of test computer 102 using system bus 131.

Further, test computer 102 executes the test programs and sends control signals to channel 106 and capture instrument 108 through test computer interface 104. The control signals may direct channel 106 to receive an output signal generated by DUT 112 through tester pin 110, and then send the output signal to capture instrument 108 using line 118. The control signals may also direct capture instrument 108 to sample the output signal, convert the sampled data to digital form if necessary, and then store the resulting data in local memory 128.

Next, the test program may direct tester 100 to move the data from local memory 128 to main memory 126 so that processor 124 can analyze the data. Accordingly, test computer interface 104 receives the data from local memory 128 through internal bus 116, and presents the data to main memory 126 using internal bus 114.

In order to obtain analysis results that are most useful, capture instrument 108 must sample the output signal generated by DUT 112 using a fast sampling rate. It is known by persons skilled in the art that a signal having a bandwidth equal to B Hz is uniquely represented by a group of samples taken every ½ B seconds. This means that the group of samples contains all of the amplitude and phase information carried by the signal. As a result, the signal can be reconstructed from the group of samples with no added distortion. Accordingly, capture instrument 108 preferably samples the received output signal using a sampling rate that is greater than or equal to 2 B Hz.

However, the maximum sampling rate of capture instrument 108 might be less than 2 B Hz. For example, FIG. 1B shows a timing diagram in which OUTPUT SIGNAL represents an output signal generated by DUT 112; EDGE 130, 132, and 134 represent times when capture instrument 108 samples OUTPUT SIGNAL; samples 1, 2, and 3 represent a group of samples; and, $T_{MIN}$ is the minimum sampling period of capture instrument 108. If $T_{MIN}$ is greater than ½ B seconds, where B Hz is the bandwidth of OUTPUT SIGNAL, then a condition known as "undersampling" results. A typical consequence of undersampling is that the group of samples, consisting of samples 1, 2, and 3 for this example, does not contain all of the amplitude and phase information carried by OUTPUT SIGNAL. It follows that an analysis of the group of samples by processor 124, for obtaining information about OUTPUT SIGNAL, will not yield accurate results.

Although tester 100, shown in FIG. 1A, has been used to sample output signals generated by DUT 112 for subsequent conversion and analysis, it would be desirable to have a method of sampling an analog signal produced by a DUT that produces a group of samples containing all amplitude and phase information carried by the analog signal. It would also be desirable for the method to produce the group of samples using a sampling rate that is less than 2 B Hz, where B Hz is a bandwidth of the analog signal.

SUMMARY OF THE INVENTION

With the foregoing background in mind, it is an object of the invention to provide a tester that can obtain a set of data samples that is sufficient to represent an analog signal generated by a device under test.

Another object is to provide a tester that can obtain a set of data samples that is sufficient to represent an analog signal while using a sampling rate that is less than 2 B Hz, where B Hz is a bandwidth of the analog signal.

The foregoing and other objects are achieved by calculating an effective frequency, $F_{EFF}$, using a repetition frequency, $F_{REP}$, of an electronic signal generated by a device under test. The tester then samples a plurality of consecutive replications of the electronic signal using a sampling rate that is equal to $F_{EFF}/K$, where K is a positive integer value other than one, until a set of N data samples is acquired. The value, K, is chosen so that K and N have no common multiplicative factors. The set of N data samples is then reordered to facilitate subsequent analysis of the data samples.

One feature of the invention is that a set of equally-spaced data samples can be obtained that is sufficient to represent one of the replications of the electronic signal.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1A is a block diagram of a prior art tester, FIG. 1B is a timing diagram used to describe the sampling method of the prior art, FIG. 2A is another block diagram of a prior art tester.

DESCRIPTION OF THE PREFERRED EMBODIMENT

Figure 2B:
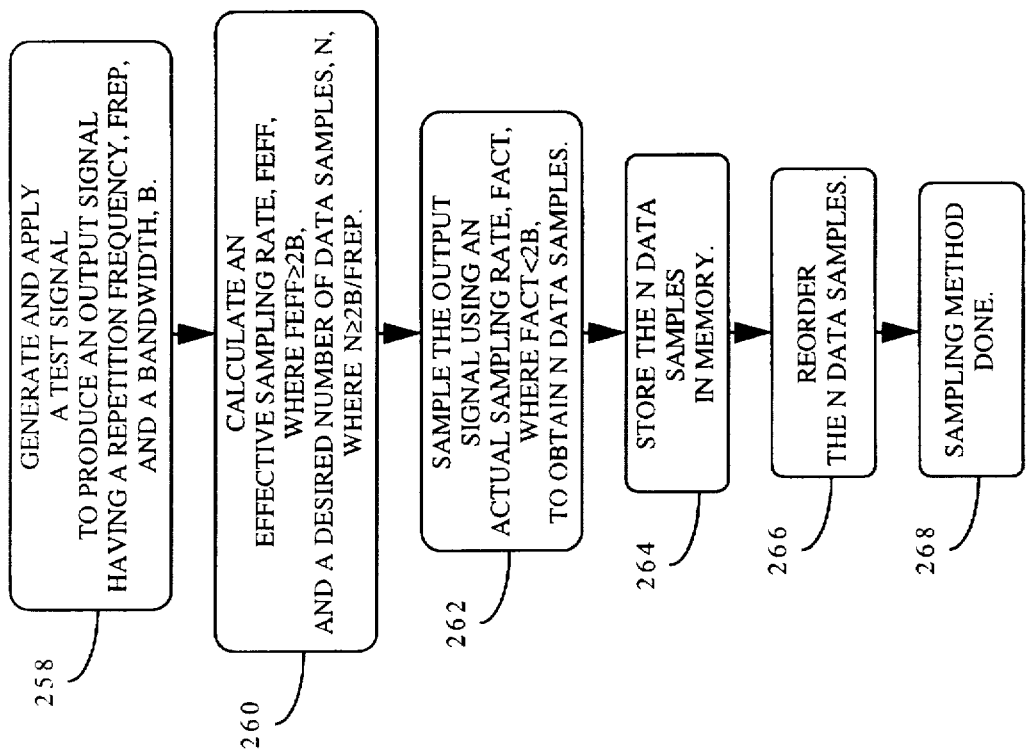
FIG. 2B is a flowchart depicting the sampling method of the present invention.

FIG. 2A shows an embodiment of a tester that is capable of both sampling a signal at a node of an electronic device to produce a set of data samples, and analyzing the data samples using data processing techniques. The circuitry for tester 200 is normally enclosed in a tester body (not shown) comprising both an electronics cabinet and a test head. The tester body is usually separated from DUT 212 by interface hardware including numerous tester pins, such as tester pins 210, 239, 241, and 243.

Computer work station 235 controls tester 200. A test engineer typically develops test programs, which include numerous test functions, on work station 235. The test engineer then loads the test programs into main memory 218 of test computer 202 using system bus 237. The test engineer also typically enters commands for tester 200 at work station 235. For example, the test engineer might enter a command either to start a test or to specify certain operating parameters. Finally, tester 200 sends test results on system bus 237 to work station 235, which displays the results to the test engineer.

Tester 200 makes numerous connections to DUT 212. In particular, tester pins 210, 239, 241, and 243 are connected to different electrical nodes of DUT 212. In general, a channel applies a test signal to a node of DUT 212 through one of the tester pins. Another channel then detects an output signal from another node of DUT 212 through another one of the tester pins. The test programs executed by tester 200 usually specify characteristics of both the test signals applied to DUT 212, and the output signals tester 200 expects to receive from DUT 212.

Test computer 202 sends programming and control signals to test computer interface 204 on internal bus 226. Test computer interface 204 then buffers the signals and presents them to channels 206, 245, 247, and 249, and capture instruments 208, 251, 253, and 255, using internal bus 228. Test computer interface 204, and internal buses 226 and 228, are also used to move data samples from respective local memories of the capture instruments, in particular local memory 224, to main memory 218.

In a typical mode of operation, test computer 202 sends commands through test computer interface 204 to both channel 206 and capture instrument 208 to program them for an upcoming test. For example, test computer 202 may program channel 206 to receive an output signal from DUT 212 through tester pin 210, and then present the output signal to capture instrument 208 on line 230.

Additionally, test computer 202 may program capture instrument 208 to sample the output signal using sample-and-hold 220, convert the data samples from analog to digital form using A-to-D converter 222, and then store the digital data in local memory 224. Finally, test computer 202 may control movement of digital data from local memory 224 to main memory 218 through test computer interface 204, so that processor 214 can analyze the data. For example, processor 214 commonly uses digital signal processing (DSP) techniques to perform operations such as sine wave analysis, multi-tone analysis, pulse analysis, ramp analysis, video analysis, digital communications analysis, digital filtering, decoding, instrument calibration, and sinewave generation.

It is known that a group of data samples contains all amplitude and phase information carried by an electronic signal if the data samples are taken every ½ B seconds, where B Hz is a bandwidth of the electronic signal. However, if data samples are taken at a rate that is less than 2 B Hz, then a condition known as "undersampling" results. In this case, the group of data samples typically will not contain all of the amplitude and phase information carried by the electronic signal. A substantial advantage of the present invention is that it enables a tester to acquire a group of data samples containing all amplitude and phase information carried by an electronic signal, while sampling the electronic signal using a sampling rate that is less than 2 B Hz (where B Hz is the bandwidth of the electronic signal).

In the preferred embodiment, the test engineer implements the sampling method of the present invention in accordance with the procedure shown in FIG. 2B. First, the test engineer programs tester 200 to generate and apply a test signal to a node (not shown) of DUT 212 in block 258, thereby causing DUT 212 to produce an output signal having a repetition frequency, $F_{REP}$, and a bandwidth, B.

Next, in block 260, the tester uses the bandwidth, B Hz, and the frequency, $F_{REP}$, to calculate an effective sampling rate, $F_{EFF}$, and a number of data samples, N, which is sufficient for capturing all amplitude and phase information carried by the output signal. The effective sampling rate, $F_{EFF}$, is preferably greater than or equal to 2 B Hz. Further, the effective sampling rate satisfies a relationship, $F_{EFF} = NF_{REP}$. As a result, the number of data samples, N, is preferably greater than or equal to $2 B/F_{REP}$. As an illustrative example, the effective sampling rate, $F_{EFF}$, is equal to 2 B Hz; and, the number of data samples, N, is equal to $2 B/F_{REP}$.

In block 262, the tester samples the output signal using an actual sampling rate, $F_{ACT}$, which is less than 2 B Hz. This means that the actual sampling rate, $F_{ACT}$, is equal to 2 B/K Hz, where K is a positive integer value. This also means that more than one replication of the output signal must be sampled, at the rate 2 B/K Hz, to obtain the number of data samples, N. The tester then stores the N data samples in contiguous memory locations in block 264.

The value, K, is calculated as follows. First, an integer value, K, which satisfies a relationship, $K > 2 B/F_{MAX}$, is determined, where $F_{MAX}$ is a maximum sampling rate of the tester. Next, if K and N contain common factors, then K is incremented until there are no common factors among K and N. Otherwise, K is not incremented. For this illustrative example, $F_{MAX}$ is equal to $F_{EFF}$, which is 2 B Hz. It follows that K must satisfy the relationship, $K > 2 B/2 B$. Accordingly, the value, K, must be greater than one.

Generally, N data samples, one data sample taken every K/2 B seconds, do not correspond with N adjacent data samples within one replication of a sampled output signal. This is because more than one replication of the output signal must be sampled at the rate of 2 B/K Hz to obtain the set of N data samples. Consequently, the set of N data samples is preferably reordered in block 266 before being analyzed by the test computer.

The test engineer programs the tester to reorder the set of N data samples as follows. First, N adjacent data samples within one replication of the sampled output signal are numbered from 0 to N−1. The current memory locations of the N adjacent data samples are then calculated using a relationship.

$$location(i) = [(i)(K)] \mod(N),$$

where i ranges from 0 to N−1 and represents an iTH adjacent data sample, and location(i) is a current memory location of the iTH adjacent data sample. After the current memory location of each adjacent data sample is known, the test engineer can program the tester for ordering the N data samples so that the set of data samples corresponds with N adjacent data samples within one replication of the sampled output signal. This facilitates subsequent analysis of the data samples.

Figure 2C:
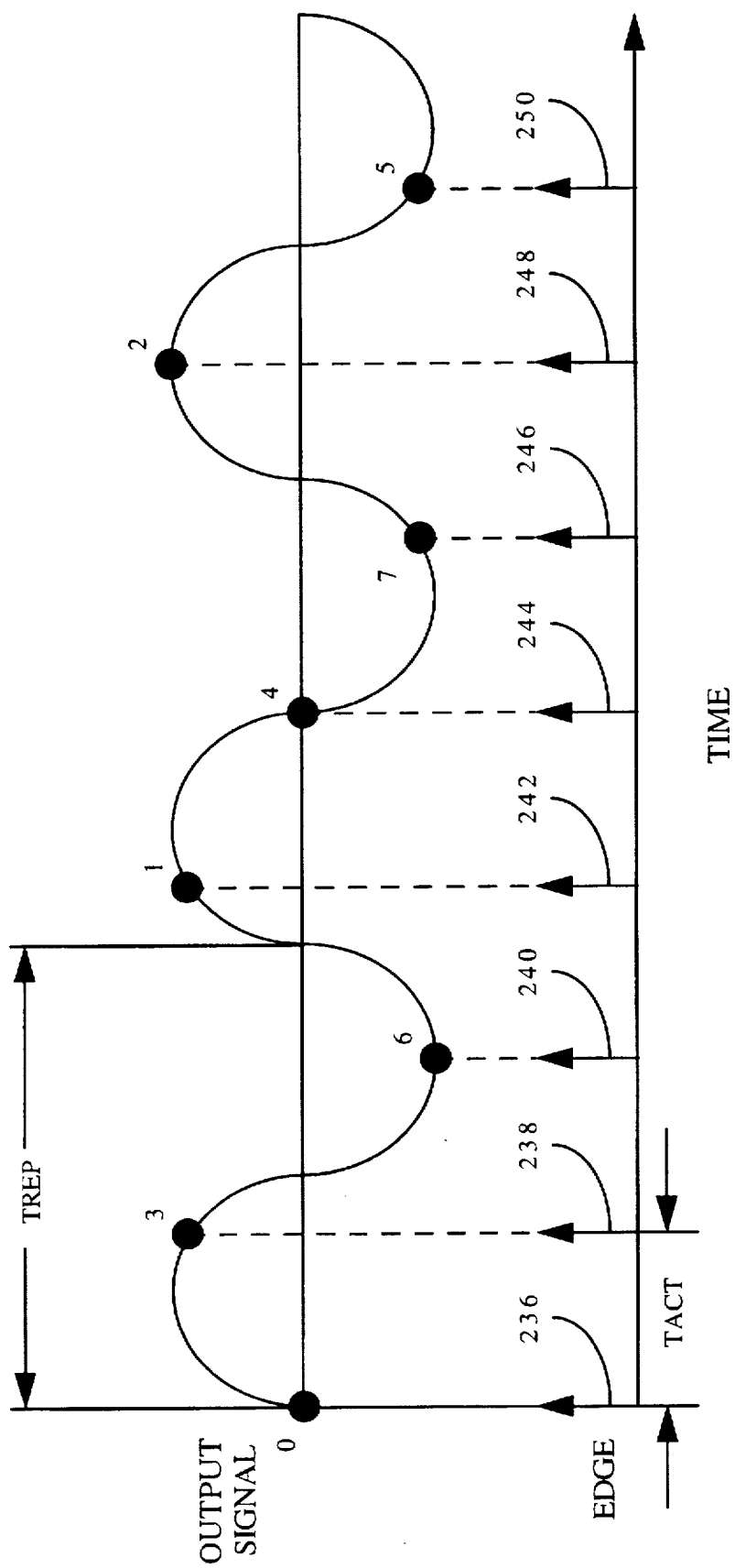
FIG. 2C is a timing diagram used to describe the sampling method of the present invention.

FIG. 2C is a timing diagram that is useful for describing the method of the present invention. OUTPUT SIGNAL repeats every TREP seconds, and three replications of OUTPUT SIGNAL are shown. Further, EDGE 236, 238, 240, 242, 244, 246, 248, and 250 represent times when sample-and-hold 220 samples OUTPUT SIGNAL during the three replications of OUTPUT SIGNAL, and TACT is an actual sampling period used by sample-and-hold 220.

As mentioned above, the method of the present invention includes the step of sampling OUTPUT SIGNAL using a sampling rate that is less than 2 B Hz, where B Hz is the bandwidth of OUTPUT SIGNAL. Accordingly, TACT is equal to K/2 B, where K is a positive integer. The positive integer, K, also satisfies the relationship, K>2 B/FMAX, where FmX is a maximum sampling rate of sample-and-hold 220.

For the illustrative example shown in FIG. 2C, FMAX is equal to 3 Hz, B is equal to 4 Hz, and TREP is equal to 1 Hz. As a result, FEFF is greater than or equal to 2 B Hz, or 8 Hz; N is greater than or equal to 2 BTREP, or 8; and K must be greater than 2 B/FMAX, or 2.67. For this example, let FEFF be equal to 8 Hz, N be equal to 8, and K be equal to 3. Because N=8 and K=3 have no common multiplicative factors, K is not incremented. It follows that TACT is equal to ⅓(4) seconds, or 0.375 seconds. Accordingly, a set of eight data samples is obtained at the times represented by EDGE 236, 238, 240, 242, 244, 246, 248, and 250. The eight data samples are then stored in contiguous memory locations in local memory 224.

Because more than one replication of OUTPUT SIGNAL must be sampled at the rate of 1/TACT Hz, or 2.67 Hz, to obtain the set of eight data samples, the eight data samples do not correspond with eight adjacent data samples within one replication of OUTPUT SIGNAL. FIG. 2C shows eight data points numbered from 0 to 7, which correspond with the eight adjacent data samples within one replication of OUTPUT SIGNAL. Accordingly, the eight data samples, which correspond with the eight data points, are ordered in the contiguous memory locations as follows: 0, 3, 6, 1, 4, 7, 2, and 5.

Figure 2D:
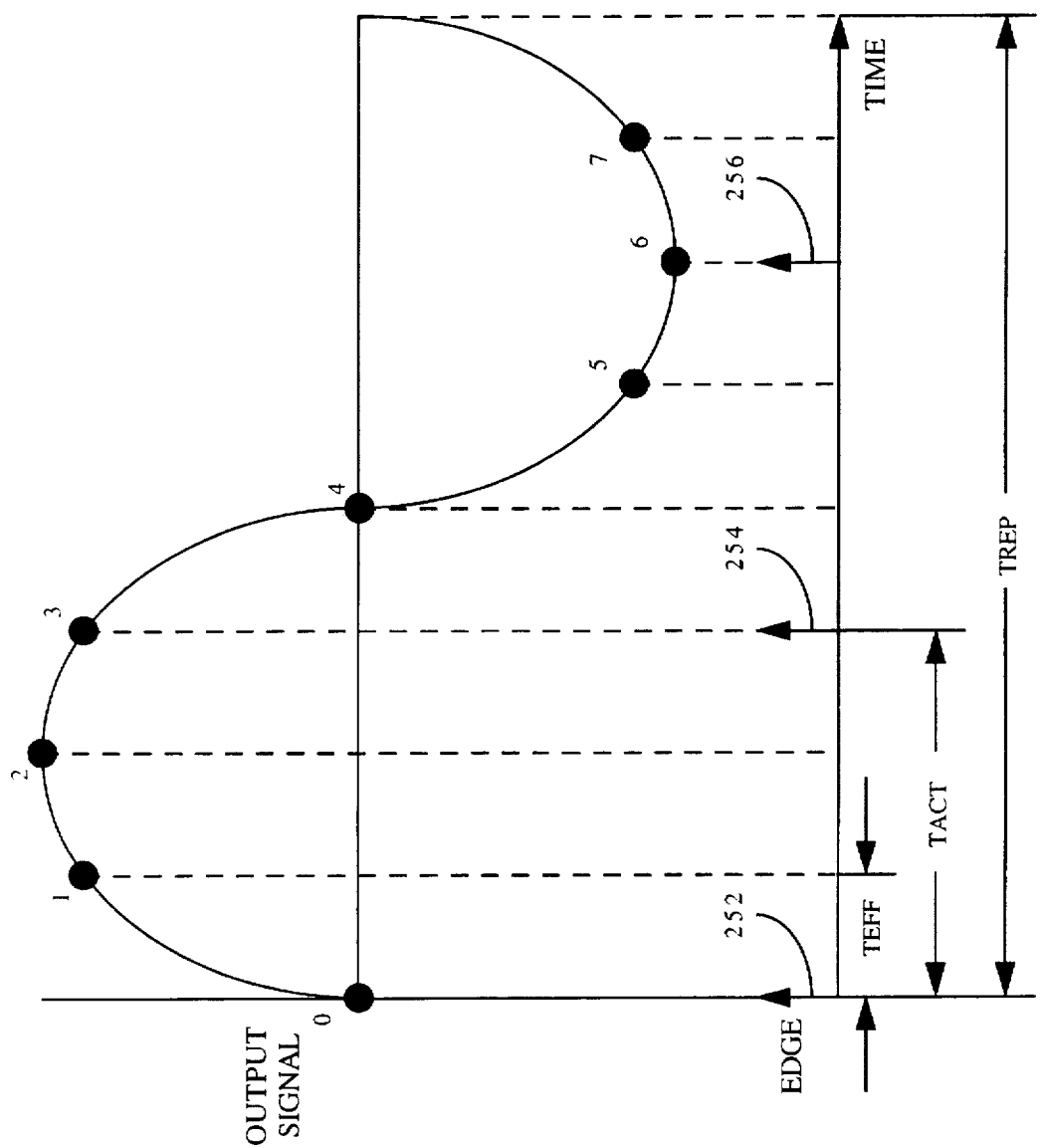
FIG. 2D is another timing diagram used to describe the sampling method of the present invention.

FIG. 2D shows how the eight data samples in the contiguous memory locations can correspond with eight adjacent data points within one replication of OUTPUT SIGNAL after the eight data samples are reordered in accordance with the present invention. One replication of OUTPUT SIGNAL is shown. Further, EDGE 252, 254, and 256 correspond with EDGE 236, 238, and 240, respectively, of FIG. 2C. Finally, FIG. 2D clearly shows that after reordering the eight data points of FIG. 2C, the reordered data points of FIG. 2D correspond with data samples that would be obtained if one replication of OUTPUT SIGNAL were sampled every TEFF seconds.

Memory controller 216 calculates current memory locations in local memory 224 for the eight data samples using a relationship, $$location(i) = [(i)(3)] \mod(8),$$

where location(i) is a location in local memory 224 of an iTH adjacent data sample within one replication of OUTPUT SIGNAL.

It can be shown, using the above relationship, that the adjacent data samples 0, 1, 2, 3, 4, 5, 6, and 7 are currently stored in locations 0, 3, 6, 1, 4, 7, 2, and 5, respectively, of local memory 224. Tester 200 then moves data samples 0, 1, 2, 3, 4, 5, 6, and 7 from their current memory locations in local memory 224 to consecutive memory locations in main memory 218 to facilitate subsequent analysis of the data samples by processor 214.

Having described one embodiment, numerous alternative embodiments or variations might be made. For example, it was shown in FIG. 2C that the sampling method of the present invention can be applied to a periodic sinewave. However, this implementation is merely an illustration. The sampling method can be applied to any electronic signal that can be repetitively replicated.

Also, it was described that the set of N data samples, derived from the sampling method of the present invention, is reordered to facilitate subsequent data analysis. However, this implementation is also merely an illustration. The manner in which the data samples are presented to the test computer may depend upon the type of data analysis to be applied. Accordingly, alternative reordering methods might be used to prepare the data samples for analysis.

Also, it was also described that a first sample in a set of N data samples corresponds to a point of an output signal defining a start of a replication. However, this is merely an illustration. The first sample might be taken at any convenient point in the output signal.

Also, it was described that data samples are stored in consecutive locations in memory. However, this is also merely an illustration. The data samples may be stored in memory in any fashion that facilitates subsequent analysis of the data samples by a test computer.

Also, it should be appreciated that the prior art tester architectures shown in FIG. 1A and FIG. 2A are merely illustrations. The invention might be used to sample a signal produced by a DUT in a tester of any architecture. The invention might also be used in other applications where it is desired to achieve an effective sampling rate that is faster than an actual sampling rate.

Therefore, the invention should be limited only by the spirit and scope of the appended claims.

What is claimed is:

1. A method of operating a tester for sampling an output signal produced by a device under test, comprising:
   (a) calculating an effective sampling frequency, FEFF;
   (b) sampling a plurality of replications of the output signal at an actual frequency, FACT, to produce a first set of sampled data elements,
      wherein the effective sampling frequency satisfies a first mathematical relationship, FEFF=NFREP, N being the number of data elements in the first set, and FREP being the repetition frequency of the output signal,
      wherein the actual frequency satisfies a second mathematical relationship, FACT=FEFF/K, K being a positive integer value other than one, and
      wherein K and N have no common multiplicative factors; and
   (c) reordering the first set of sampled data elements, thereby producing a second set of sampled data elements that represents sampled data elements that would be obtained by sampling one of the plurality of replications of the output signal at the effective sampling frequency calculated in step (a), wherein the reordering in step (c) comprises the substeps of (c1) calculating a respective location in the first set for each data element sampled in step (b) using a third mathematical relationship, $$\text{location}(i)=((i)(K))\bmod(N),$$

i being an integer value ranging from 0 to N−1, inclusive, and (c2) sequentially moving the data elements from the calculated respective locations in the first set, starting with location(0) and ending with location(N−1), to consecutive locations in the second set.

2. The method of claim 1, wherein the tester has a maximum sampling rate, $F_{MAX}$, and wherein K is greater than $F_{EFF}/F_{MAX}$.

3. The method of claim 2, wherein B Hz is a bandwidth of the output signal, and wherein $F_{EFF}$ is greater than or equal to 2 B Hz.

4. The method of claim 1 used in a method for manufacturing an electronic device comprising:

(a) placing the electronic device in a test fixture;

(b) applying power and test signals to the electronic device; and (c) comparing output signals, generated by the electronic device in response to the test signals, with expected response data to verify operation of the electronic device, thereby determining whether the electronic device contains manufacturing defects.

* * * * *